United States Patent [19]

Bates et al.

[11] Patent Number: 5,049,978

[45] Date of Patent: Sep. 17, 1991

[54] CONDUCTIVELY ENCLOSED HYBRID INTEGRATED CIRCUIT ASSEMBLY USING A SILICON SUBSTRATE

[75] Inventors: David A. Bates, Fayetteville; Ronald B. Browne, Liverpool; David P. Smith, Clay, all of N.Y.

[73] Assignee: General Electric Company, Syracuse, N.Y.

[21] Appl. No.: 579,652

[22] Filed: Sep. 10, 1990

[51] Int. Cl.$^5$ .................. H01L 23/12; H01L 23/14; H01L 23/06; H01L 23/10
[52] U.S. Cl. ........................................ 357/74; 357/75; 357/80; 357/81
[58] Field of Search ................. 357/74, 75, 80, 81

[56] References Cited

U.S. PATENT DOCUMENTS

| | | | |
|---|---|---|---|
| 3,899,361 | 8/1975 | Cline et al. | 437/14 |
| 3,899,362 | 8/1975 | Cline et al. | 437/14 |
| 3,902,925 | 9/1975 | Anthony et al. | 437/14 |
| 3,998,662 | 12/1976 | Anthony et al. | 437/14 |
| 4,672,421 | 6/1987 | Lin | 357/74 |
| 4,695,872 | 9/1987 | Chatterjee | 357/74 |
| 4,739,389 | 4/1988 | Goedblood | 357/75 |
| 4,783,695 | 11/1988 | Eichelberger et al. | 357/67 |
| 4,811,082 | 3/1989 | Jacobs et al. | 357/75 |
| 4,894,115 | 1/1990 | Eichelberger et al. | 156/644 |

Primary Examiner—Rolf Hille
Assistant Examiner—S. V. Clark
Attorney, Agent, or Firm—Richard V. Lang; Paul Checkovich; Fred Jacob

[57] ABSTRACT

A conductively enclosed hybrid integrated circuit assembly for use with microwave and millimeter wave signals is disclosed. The enclosure utilizes a silicon substrate into which recesses are formed by conventional silicon etching processes to support individual MMIC chips with their surfaces flush with the unetched substrate surfaces. The assembly is covered with a thin solid dielectric layer, perforated over points of connection and followed by a metallization to provide point-to-point connections. The arrangement provides one or more levels of patterned metallizations with additional levels being provided either by additional dielectric layers or by forming the silicon substrate from three or more laminar elements and providing a patterned metallization on the surface of an intermediate element. Efficiency in signal grounding and in rf transmission line paths is assured by surface metallizations and the provision of low impedance paths through the substrate. Fully hermetic seals are provided using conventional silicon processing. Input/Output connections may be either electrical or optical.

15 Claims, 3 Drawing Sheets

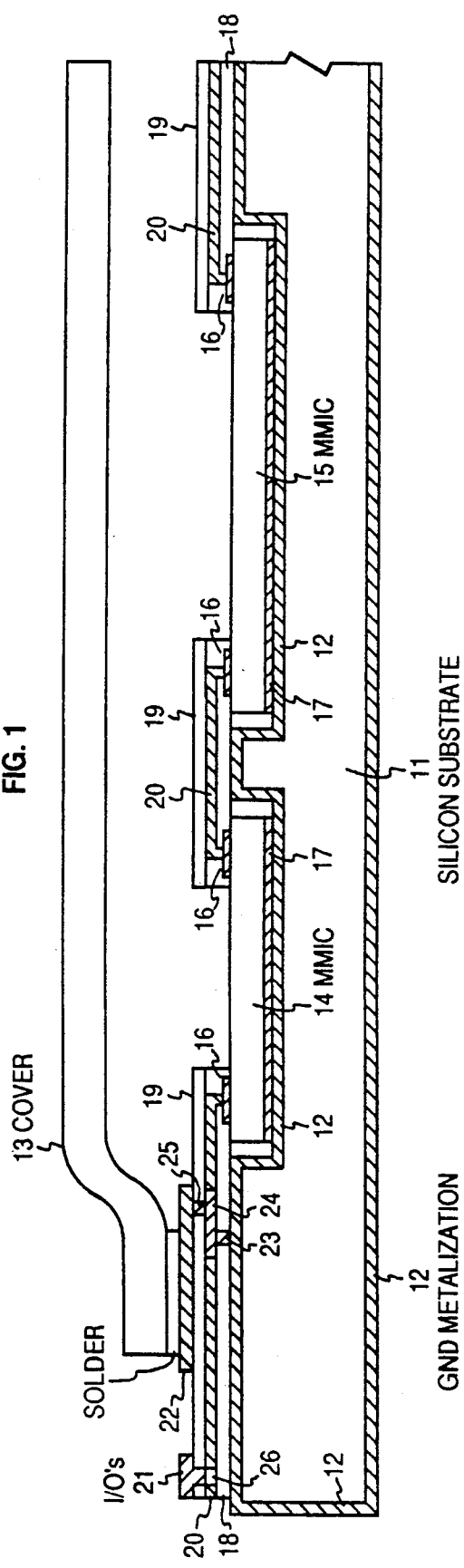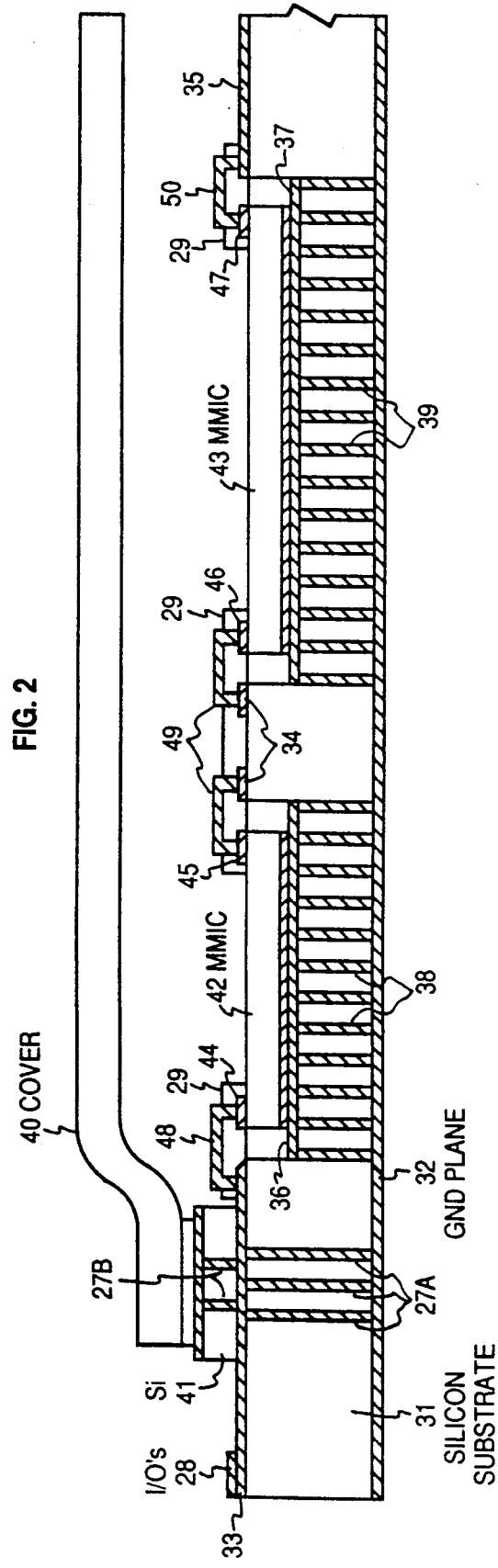

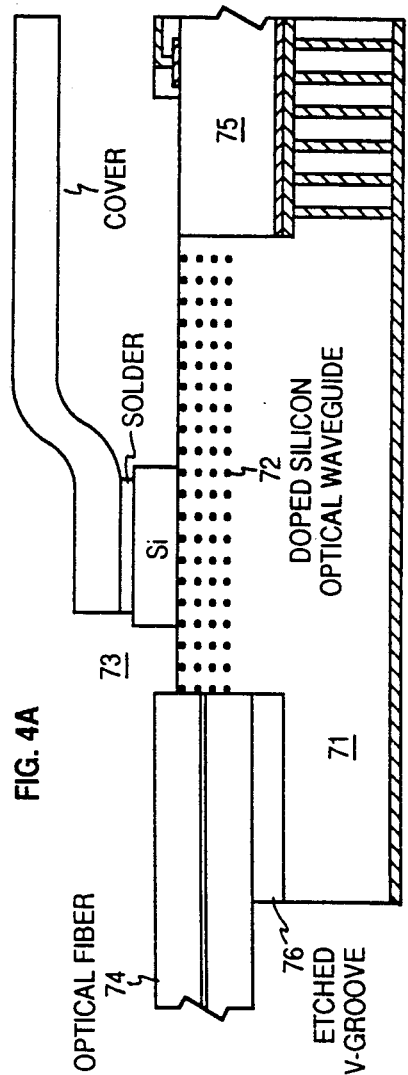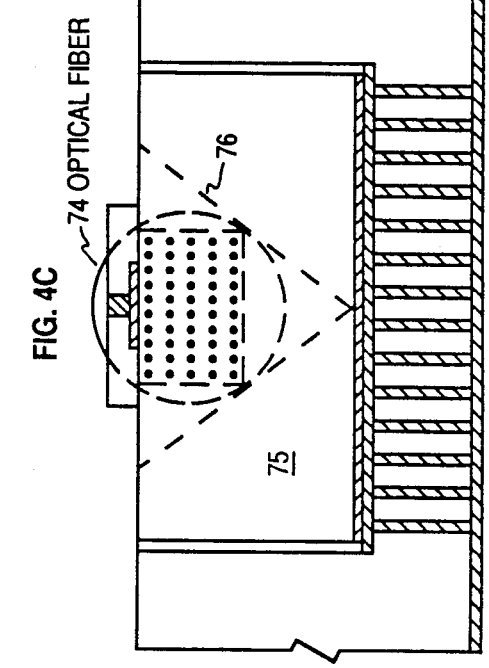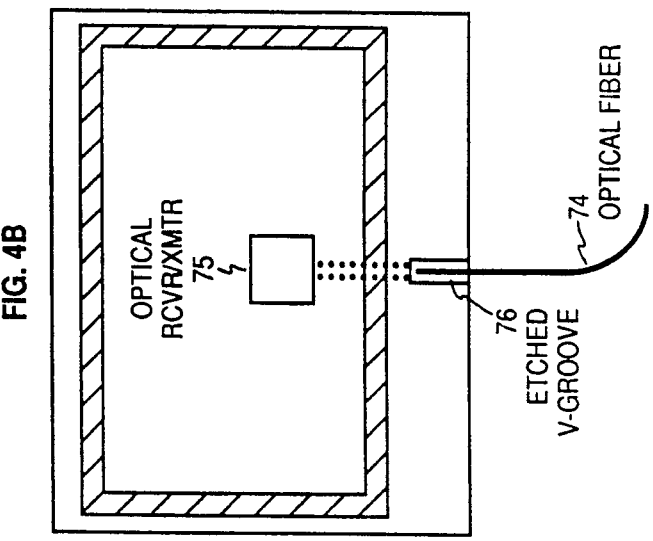

CONDUCTIVELY ENCLOSED HYBRID INTEGRATED CIRCUIT ASSEMBLY USING A SILICON SUBSTRATE

BACKGROUND OF THE INVENTION

1. Field of the Invention

The invention relates to the packaging of integrated circuits for use with microwave and millimeter wave signals. The invention relates more particularly to the packaging of hybrid interconnected integrated circuits, typically of a monolithic microwave construction which incorporates passive and active components, i.e. "MMIC" chips, and the packaging of such MMIC chips in a sealed enclosure, typically hermetically sealed.

2. Description of the Prior Art

Monolithic microwave integrated circuit (MMIC) technology has proven useful in electronic circuitry operating at frequencies in the Gigahertz range. Currently, the MMIC technology is in use in frequencies from a Gigahertz to frequencies above 100 Gigahertz. A preferred material for the individual chips is one of the preferred high frequency semiconductor materials such as gallium arsenide. In fabricating the chips both passive and active circuit elements are photolithographically patterned. Because of a variety of fabrication and performance problems, it is usually most convenient to make up higher level circuits or "modules" from a plurality of interconnected MMIC chips thus creating a "hybrid" integrated circuit assembly. A common module is a microwave transmit/receive module for use in phased array systems in use in satellite communication and in radar systems.

For performance reasons, each module should contain all the circuitry directly associated with an antenna element and required for processing signals at the transmitted frequencies. Within the modules, which tend to become quite small at the higher frequencies, the individual chips should be interconnected by connections which preserve transmission line quality (i.e. maintain transmission line impedances and avoid reflection causing discontinuities) and which are short to minimize time delays in processing the signal. Since the MMIC chips are frequently subject to digital phase and amplitude controls, a collection of interconnected MMIC chips making up a module may require a large number of interconnections which, as the module sizes go down, become more and more closely spaced.

The high density interconnection (HDI) technique described in two patents assigned to the Assignee of the present application (U.S. Pat. No. 4,783,695, filed Sept. 26, 1986 entitled "Multichip Integrated Circuit Packaging Configuration and Method"/C. W. Eichelberger and R. J. Wojnarowski and U. S. Pat. No. 4,894,115, filed Feb. 14, 1989 and entitled "Laser Beam Scanning Method for Forming Via Holes in Polymer Materials"/C. W. Eichelberger, R. J. Wojnarowski and K. B. Welles), describes a method of interconnecting MMIC chips requiring the high density of connections adequate to meet the need in such modules.

The HDI process, however, conventionally uses a substrate of alumina supporting MMIC chips of gallium arsenide. In the hybrid assembly, the chips are supported in the alumina substrates with their upper surfaces and with the upper surface of the substrate flush. Then a metallizable dielectric layer in the form of a thin (1 mil) solid sheet is adhered to the flush surfaces. The dielectric layer bridges small gaps in the underlying surface and accommodates small variations in the height of the surfaces. The chips and substrate are electroded prior to the application of the dielectric, and after the dielectric layer is applied "via" holes are etched down through the dielectric to these electrodes. A patterned metallization, as described in the cited patents, is then formed on the dielectric layer which only connects the pads exposed at vias.

The problem of achieving the flush surfaces in the known process is solved in an alumina substrate by a machining process or by casting in recesses, or by inserting shims under the chips, etc. Machining is a very difficult process since the material is quite hard, granular and fragile in thin sections. While other materials, such as silicon, may have been suggested as providing a suitable substrate for use with the high density method of hybrid interconnection, no realizations of hybrid circuits using a silicon substrate are known nor are any fully enclosed or hermetically sealed assemblies for hybrid interconnected MMICs known using a silicon substrate.

In addition to the fabrication problem associated with achieving flush surfaces, alumina material, which is both granular and opaque, is not readily adapted to receive fiber optic connections for signal or control purposes. Such connections are of increasing interest where high density interconnections are required.

SUMMARY OF THE INVENTION

It is an object of the present invention to provide an improved enclosed hybrid integrated circuit assembly.

It is another object to provide an improved hermetically sealed hybrid integrated circuit assembly.

It is an additional object to provide an improved sealed hybrid integrated circuit assembly for operational microwave and millimeter waves.

It is still another object to provide a sealed hybrid integrated circuitry assembly providing efficient transmission line paths between the individual chips, and through the package seals to the I/O terminals.

It is a further object to provide an improved hermetically sealed hybrid integrated circuit assembly which accepts optical I/O connections.

It is still another object of the invention to provide an improved hermetically sealed hybrid integrated circuit in which efficient transmission line paths may be provided both within the package and through the package seals.

These and other objects of the invention are achieved in a novel hybrid integrated circuit assembly. The assembly comprises a substrate of silicon having flat bottomed, shallow recesses for reception of an integrated circuit (IC) chip. The recesses are conveniently formed by either a dry plasma etch, which provides recesses with acceptably flat bottoms or by a wet etch, both of which are well established techniques for processing silicon. A first patterned metallization for internal and input/output (I/O) connection is applied to the upper surface of the substrate and a general surface metallization for signal grounding is provided to the under surface of the substrate. In addition, the conductive surfaces are formed on bottoms of the recesses. These conductive surfaces are connected to the substrate ground to provide a low impedance signal grounds under the signal paths to maintain transmission line efficiency.

The integrated circuit chips have a thickness to which the depths of the recesses are matched so that when the chips are assembled into the recesses their upper surfaces are coplanar with the unetched upper surface of the silicon substrate. The chips are aligned with their terminal pads exposed and their ground plane underneath, thus tieing the chip grounds to the substrate grounds at the bottoms of the recesses, the latter being connected to the substrate signal ground.

A thin solid dielectric layer is provided for supporting a second patterned metallization. The dielectric layer is bonded to the coplanar surfaces of the chips and substrate and bridges the existing gaps. The dielectric layer is perforated by an oblating laser, typically subject to programmed positioning, with the perforations occurring over the chip terminal pads and over the points in the patterned substrate metallization where connections are to be made.

The second patterned metallization is then applied to the dielectric layer, penetrating the perforations and providing connections between chip terminal pads and between chip terminal pads and I/O connections. The two patterned metallizations, which are on differing levels, provide flexibility in connection, including electrical cross-overs.

In order to avoid interaction with the active circuits, the second patterned metallization and the supporting dielectric are generally removed by programmed laser oblation from all but the chip terminal areas.

The assembly is sealed by bonding the cover to the substrate. In accordance with a first embodiment of the invention, a second metallizable dielectric layer is provided in the vicinity of the cover for the purpose of providing a seal, electrically isolated from the second patterned metallization.

In accordance with a second embodiment of the invention, a silicon wall is provided for achieving a fully hermetic seal. The silicon wall is bonded by a diffusion bond to the under lying silicon substrate, and its upper surface is provided with a metallized surface to which the cover, which is metallic, may be soldered. To ground the cover to the substrate ground, thermal gradient zone melting may be employed in the seal region.

In a third embodiment, means are provided for achieving additional interconnection density without interference with MMIC circuitry, by the provision of a multi-layered silicon substrate providing an additional surface for application of a patterned metallization. In the illustrated embodiment, two patterned metallizations are provided in the manner illustrated in the second embodiment, and a third patterned metallization is provided on the under surface of the second of three silicon members making up the silicon substrate. The foregoing construction maintains fully hermetic seals throughout.

In a final embodiment of the invention, means are disclosed for passing optical signals through the seal of a hermetically sealed package. The disclosed means includes an optical waveguide formed by diffusion into the silicon substrate and interconnecting an optical fiber providing an optical I/O terminal attached to the substrate outside of the seal. A transmit/receive optical component, which is formed on a chip and supported in a recess in the silicon substrate, provides the interior interface with the I/O terminal.

BRIEF DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

FIG. 1 is a cross-section view of an enclosed hybrid integrated circuit assembly for operation at microwave and millimeter waves utilizing a surface metallized silicon wafer as the substrate and for interconnection and I/O terminates two metallizable dielectric layers in accordance with a first embodiment of the invention;

FIG. 2 is a cross-section view of a hermetically sealed hybrid integrated circuit assembly in accordance with a second embodiment of the invention utilizing a silicon substrate with patterned surface metallizations, through the substrate conductive regions and a simple metallizable dielectric layer for interconnection and I/O terminals;

FIGS. 4A, 4B and 4C are views of a fiber optic I/O terminal to a hermetically sealed hybrid integrated circuit assembly, FIG. 4A being a cross-section view of the I/O terminal along the axis of the optical fiber, FIG. 4B being a plan view of the I/O terminal and FIG. 4C being a cross-section view transverse to the axis of the optical fiber.

DESCRIPTION OF THE PREFERRED EMBODIMENT

Figure 3:
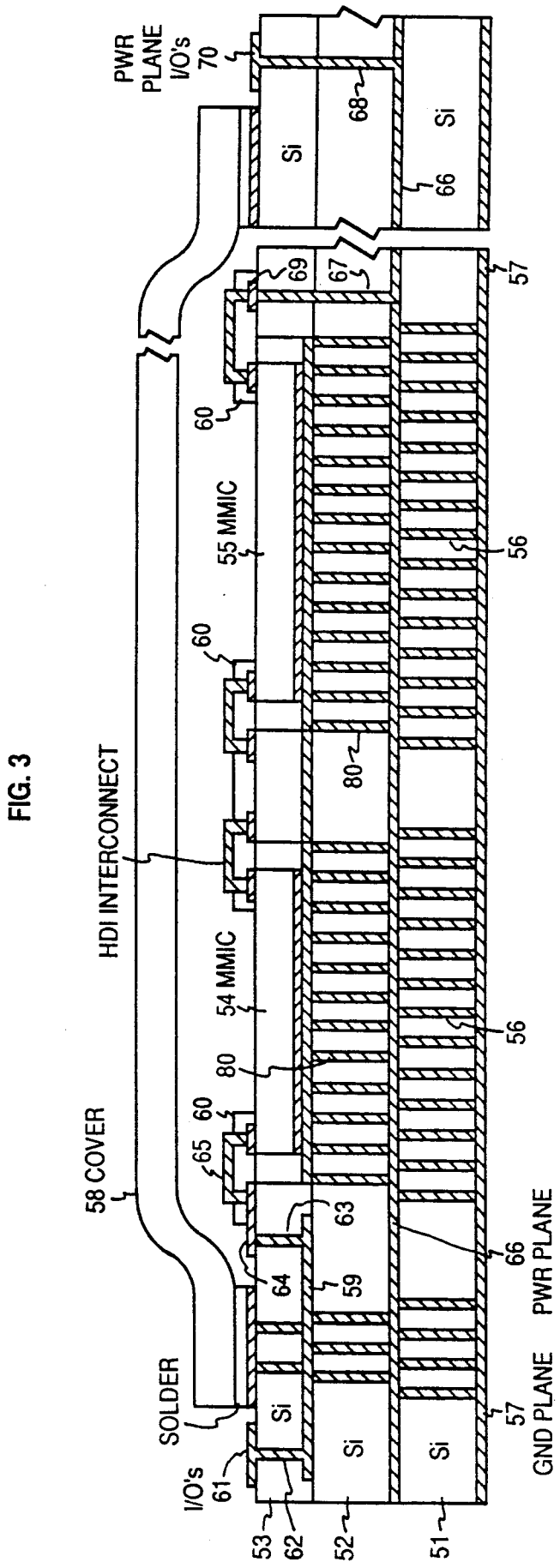
FIG. 3 is a cross-section view of a hermetically sealed hybrid integrated circuit assembly utilizing a multilayered silicon substrate with patterned metallizations on the upper surface of the first layer and on an intermediate layer and a metallizable dielectric layer for interconnection and I/O terminals.

An enclosed hybrid integrated circuit assembly in accordance with a first embodiment of the invention is shown in cross-section in FIG. 1. The arrangement has as its principal components a substrate 11 of degeneratively doped, high electrical conductivity silicon, metallized over its entire surface as shown at 12, a cover 13 of Kovar which is sealed to the substrate, and two monolithic microwave circuit (MMIC) chips 14, 15 set in recesses in the silicon substrate under the protection of the cover. The two MMIC chips are mounted in the recesses with terminal pads 16 on their exposed upper surfaces and with conductive ground planes 17 on their under surfaces bonded to the substrate metallization 12, covering the bottoms of the recesses. Also present in the FIG. 1 embodiment are two partial layers 18 and 19 of a polyimid siloxane (e.g. Dupont Kapton), patterned metallizations 20, 22 and pads 21 supported on dielectric layers 18 and 19.

The recessed arrangement for mounting the MMIC chips provides coplanar surfaces suited to the photolithographic formation of electrical connections between the MMIC chips and input/output terminals for external electrical connections to the hybrid assembly.

The creation of recesses in the silicon substrate 11 is an initial procedure in forming the assembly. The recesses are required to have substantially flat bottoms and substantially perpendicular walls for reception of the MMIC chips 14, 15.

The depth of the recesses are set equal to the thickness of the MMIC chips so that when the chips are bonded to the bottoms of the recesses, the upper surfaces of the chips are substantially coplanar with the unetched upper surface of the silicon substrate. The etching process, which creates the recesses must therefore produce a flat bottom of precribed and uniform depth to facilitate such coplanar relationships. The provision of near perpendicular walls reduces the gaps around the perimeter of the chips between substrate and chips. A minimum gap is desirable to facilitate bridging of the gap by the thin dielectric layer 18 subsequently applied and used to support conductor runs to the chip. In general, a 1 mil dielectric layer will readily bridge a 2-5 mil gap, to accommodate like tolerances in the verticality of the walls. The depth of a recess should ordinarily be within $\pm\frac{1}{2}$ mil of the combined thickness of the chip and bonding material.

A preferred etch for creating the recesses in the silicon substrate is a plasma etch. The etch is patterned by a mask of a metal such as CR, Ti W-10/90%, Ti, or Al. A first step in mask formation is the sputtering of an unpatterned layer of the plasma resistant metal covering the upper surface of the substrate.

The metal layer is then patterned. The metal layer is covered with a photoresist (e.g. Shipley), which is exposed to an optical pattern defining the recesses. After optical exposure, the photoresist, typically a positive resist, is developed. The developer chemically disolves the optically illuminated and polymerized photoresist to create openings over the metal layer defining the recesses. The regions of the metal layer from which photoresist has been removed are then exposed to an acid etch, typically phosphoric acid based etchant, to create openings in the metal mask. At this point, the unpolymerized photoresist may be removed by a suitable solvent such as acetone, its presence no longer needed.

With the metal mask patterned to contain openings defining recesses, the substrate is ready for the plasma etch. A preferred etch uses a silicon hexofluoride gas ($SF_6$) at a suitably low pressure. The etching time, depending upon depth, is from half an hour to two hours. The distribution of the flow of the plasma and its duration are regulated to give a flat bottomed recess to the desired depth with substantially perpendicular walls as mentioned earlier.

Also, as mentioned earlier, the depth of the recess is the critical dimension in the silicon etching process. Typically, the silicon substrate is from 20 to 40 mils in thickness with the MMIC chips being 4 to 12 mils in thickness. The process readily accommodates chip thicknesses to 20 mils with a proportional increase in the etching time. Since the rapidity of the etch is affected by the dopant used to provide a high bulk conductivity, the dopant is selected with this in mind as well as its compatibility for subsequent metallization, phosphorous being suitable for p type doping and boron being suitable for n type doping.

After the recesses are formed by the plasma etch, and the metal mask removed, the substrate is metallized to form a low resistance grounded surface to which soldering connections may be made. The silicon surface exposed after the metal mask is removed, is stripped of residual oxide by a buffered hydrofluoric acid rinse, in preparation for applying the ground metallization 12.

The ground metallization 12 typically consists of a thin chromium adhesion layer, followed by a second nickel barrier layer and finally a thicker gold layer, all of which may be applied by sputtering. However, the thicker gold layer may either be sputtered to a final thickness of 2.5 to 4 microns or sputtered to approximately 5000 Å and then electroplated to the final thickness. The gold provides a solderable surface to which the MMIC chips 14 and 15 may be bonded. The three layer combination provides a good electrically conductive surface and a low impedance ground plane for radio frequency signal propagation. During the metallizations, the substrate is repositioned to insure electrical continuity between top and bottom and edge regions and electrical continuity between the top regions, the walls of the recesses, and the bottoms of the recesses.

The metallized silicon substrate is now ready for attachment of the MMIC chips. The under surfaces of the MMIC chips should also be metallized in a manner suited to attachment to the metallized silicon substrate. Preferably, these under surfaces should have a gold metallization 17 for compatibility in bonding to the gold layer on the substrate 11.

Proper attachment requires that the chips be inserted into the recesses in the silicon substrate in the proper orientations and in precise lateral positions. The precision should be comparable to the demands for accuracy in the subsequent placement of the interconnecting conductors thereby minimizing impedance discontinuities in the RF interconnecting transmission line. The chip placement accuracy requirements necessary for interconnection are relieved considerably by the laser adaptive lithography feature of the HDI process (reference U.S. Pat. No. 4,835,704) and can tolerate typically $\pm 10$ mils errors. These conductors are frequently on the order of 3 mils in width to achieve 50 $\Omega$ transmission lines, and an accuracy of $\pm 2$ mils in placement of the chip is quite adequate for high performance microwave interconnection. Plasma etching of the recesses provides greater precision than other known processes, readily achieving 5-10 micron tolerances. Thus the recess itself can be fabricated with a tolerance such that chip placement accuracy of $\pm 2$ mils is easily obtained, and in effect guaranteed. Chip bonding may be by means of a eutectic die-bond or by means of an electrically conductive epoxy. Assuming a eutectic die-bond, a gold tin solder preform is placed under each chip, and the substrate is heated to the melting point of the gold/tin preform. Upon melting, the gold tin forms a eutectic mixture or solder, which upon cooling forms a rigid bond between the gold layers, and in consequence bonds the MMIC chips to bottoms of the recesses in the silicon substrate. The bond provides a good electrically and thermally conductive connection between the MMIC chips and the silicon substrate.

With the chips 14 and 15 bonded in place in recesses in the substrate 12 and having their upper surfaces substantially coplanar with unetched portions of the silicon substrate, the electrical connections may now be made by a high density interconnection (HDI) process, more fully described in the several U.S. patents discussed in the introduction, and assigned to the Assignee of the present invention.

The MMIC chips, as suggested by the FIG. 1 view, have their I/O pads 16 at their perimeters. This facilitates shorter connections to adjacent MMIC chips, and avoids or reduces conductor runs and supporting dielectric layers over the more centrally placed active MMIC circuitry. This freedom reduces the detuning and stray coupling that the HDI technique might otherwise occasion.

The next step in the interconnection process is the spray coating of all the substantially coplanar upper surfaces of the substrate and MMIC chips with a thin layer of dielectric adhesive. A suitable material is the ULTEM TM polyimid siloxane resin applied to a thickness of 10-12 microns. A continuous precast sheet 18 of a polyimid siloxane having a thickness of 25 microns (1 mil) is placed over the adhesive layer and bonded to the substrate and chips. The precast sheet 18 forms a dielectric layer which bridges the gaps around the perimeters of the MMIC chips and which will support conductor runs between MMIC I/O pads 16 on the MMIC chips and conductor runs to the package I/O pads 21 on the perimeter of the substrate 11. A suitable material for the sheet 18 is available from Dupont under the brand name "Kapton".

"Via holes" are now formed through the sheet 18 to the contact pads 16 on the top surfaces of the MMIC chips and to the metallization 12 in the vicinity of the solder bond for the cover 13. This may be done by a uv (351 nm) argon ion laser, operated to remove both the layer 18 and the underlying adhesive by oblation. The removal takes place in a narrow circular region over the pads. The contact pads, which are metallized, are designed in concert with laser operation to stop the penetration at the pads. The holes are preferably round with tapered walls with a diameter of approximately 25 microns. Other steps may be provided to clear any debris from the via holes.

With the contact pads 16 and periodic holes 23 over the substrate metallization near the cover bond uncovered through via holes, the dielectric sheet 18 is ready for metallization. Metallization is achieved by sputtering a thin unpatterned layer of a metallic conductor such as titanium. The metallization is performed such that not only the flat upper surface of layer 18 and the exposed pads are metallized but also the tapered walls of the "vias" so as to form an electrically continuous path. The sputtered titanium layer, which is of a few thousand angstroms in thickness, is then electroplated with copper to a final conductor thickness of a fraction of one mil, followed by a few thousand Angstroms of Ti sputtered on top of the Cu.

The patterning of the metallization 20 to provide point-to-point conductor runs and contact regions 24 at the cover bonds is preferably achieved using a high resolution process (HDI) not requiring conventional multi-step photolithography. A preferred method of patterning entails the same argon ion laser used to create "vias" but now operated to polymerize but not to oblate the photo-resist. The photo-resist that is selected should be sensitive at the 351 nm wavelength of the laser.

The first step in patterning the metallization 20 is the general application of a photo-resist to the metallization layer 20. The photo-resist is applied as a liquid with any excess being spun off. The laser beam which is used as an activating light source to polymerize the photo-resist, is then swept in a controlled manner over the photo-resist to define the metallization pattern. The beam, typically 3-7 microns in diameter, then sets the resolution of the narrowest feature of the metallization pattern. The laser is computer controlled to provide an overlapping raster scan of the total area of the substrate. During scanning, the beams are turned "on" for exposure of the photo-resist and "off" to avoid exposure of the photo-resist. The 3-7 micron laser beam width is finer than the most detailed feature. As earlier noted, the conductor runs may be 4.5 microns in thickness by 25 microns in width or greater. The wider conductor runs are formed by multiple, overlapping passages of the "on" beam over the photo-resist. As cited previously, adaptive computer control of the laser is automatically employed which compensates the interconnect pattern to correct for chip misplacement errors.

After laser scanning of the substrate is complete, the photo-resist is developed. In this example, the laser polymerized photo-resist has become resistant to removal by the developer—although the converse could have been chosen. The unpolymerized areas of the photo-resist are removed by the developer leaving the underlying conductive titanium/copper layers exposed. These are removed by acid etching, leaving conductive titanium/ copper only where it lies under a protective covering of polymerized photo-resist. When the removal of the uncovered copper is complete, point-to-point conductor runs 20 and expanded contact pads 24 around the cover grounding vias still protected by the polymerized photo-resist are what remains. The polymerized photo-resist may then be removed by an ether wash to expose the copper runs 20 and pads 24.

The process so far described can accommodate successive metallized dielectric layers (e.g. 18, 20), and additional layers are commonplace. Additional layers for conductor runs give the possibility of cross-overs, which are useful in both signal and dc paths. Assuming, however, that only one metallized layer (18, 20) is required for conductor runs, one more metallized dielectric layer 19, 22 is required for grounded closure of the package and for the I/O pads 21.

In closing the package, the cover 13 is soldered to the metallization 22 and electrically grounded to the metallization 12 on the silicon substrate. The grounding is electrically isolated from the conductor runs to the I/O pads 21, which pass under the grounded cover seal. The fabrication of the seal and I/O pads will now be described.

The dielectric layer 19 is applied by spinning a liquid polyimid siloxane material over the top surface of the assembly, the top surface including both the chips 14 and 15 and the metallization 20. At intervals along the seal, spaced frequently enough to achieve a suitably low impedance ground connection, laser etched via holes are now formed in the dielectric layer 19. The via holes 25 terminate on the pads 24 and the via holes 26 terminate on the ends of the conductor runs 20. The dielectric layer 19 is then coated with a thin sputtered titanium and copper plated layer 22, which as before, is unpatterned and extends down through the via holes 25 and 26. As illustrated, the via holes 25 are staggered in relation to the via holes 23, but are arranged in pairs such that each metallized pair (25, 23) makes contacts with the same pad (24). The mutually staggered arrangement of via holes 23, 25 with an enlarged intermediate pad 24 simplifies the registration of the cover ground connections for electrical continuity and improves the height-to-diameter aspect ratio of the via hole to achieve more uniform metallization thickness on the side walls of the vias. In addition the via holes 23, 25 and ground pads 24 are spaced from any patterned conductors 20 leading to the via holes 26 and the package I/O pads 21 for signal and dc connections.

The metallization 22 may now be patterned to complete the seal for the cover and provide I/O pads 21 using a conventional photo-resist process. The metallization 22, which generally extends over the silicon substrate and chips 14, 15, and which penetrates the vias 25, 26 is now coated by a photo-resist. Assuming conventional optical patterning, the photo-resist may be exposed to uv illumination through a mask to define the seal area 22 and the I/O pads 21. The seal area and I/O pad regions are then exposed through the pattern to uv illumination and polymerized. The remainder of the photo-resist layer is not exposed. The photo-resist is then processed with a developer which removes all unexposed photo-resist. The portion of the titanium/copper layer uncovered by the removal of the photo-resist, is then removed by an acid etch, leaving only the titanium/copper in the vicinity of the seal and I/O pads protected by the polymerized photo-resist. The polymerized photo-resist is then removed by an ether wash exposing a patterned conductive layer which now defines the seal metallization 22 and the I/O pads 21.

The remaining portions of the dielectric layers 18, 19 are only necessary insofar as they support the various metallizations 20, 21 and 22. Portions of the dielectric layers 18 and 19 still remaining over the active chips may now be removed by actively controlled laser oblation. Those features of the MMIC chip which affect the tuning of the circuitry are uncovered, to reduce the possibility of detuning the circuitry or creating undesirable feedback loops.

At this point, the cover 13, typically of Kovar, may be soldered down to the seal metallization 22 to complete the enclosure about the circuitry. The solder seal so formed is of a high quality, and of low permeability to moisture.

The FIG. 1 package lacks a fully hermetic seal due to the small permeability of the dielectric layers 18 and 19 to water vapor. The FIG. 1 package achieves a low through the thickness electrical impedance by use of a degeneratively doped silicon substrate.

The FIG. 2 package differs from that of FIG. 1 in the provision of a hermetic seal to the cover which is impermeable to moisture and fluids generally; in the manner of insulating the conductor runs which pass under the seal on their way to the I/O pads, in the provision of two metallization layers, which allow for cross-overs in the conductor runs and in the provisions to insure high through conductivity in the silicon substrate.

As shown in FIG. 2, the silicon substrate 31 is provided with an unpatterned metallization 32 fully covering its under surface forming the RF ground plane of the package. The top surface of the substrate is provided with first patterned metallization 33, 34, and 35 applied to the upper surface of the substrate 31 for signal, dc and ground connections. Recesses for two MMIC chips 42, 43 are provided in substrate 31, and two separate ground plane metallizations 36 and 37 are provided covering the bottoms of the recesses. The metallizations 36 and 37 and ground connected portions of the patterned metallization 33 are electrically connected to the substrate bottom metallization 32 by through-the-substrate conductive paths 38 and 39 respectively. These paths may be achieved in several ways, such as thermal gradient zone melting (TGZM) using a suitable conductive metal, such as aluminum.

In the TGZM process, which is more fully described in U.S. Pat. No. 3,899,361 entitled STABILIZED DROPLET METHOD OF MAKING DEEP DIODES HAVING UNIFORM ELECTRICAL PROPERTIES, U.S. Pat. No. 3,899,362 entitled THERMOMIGRATION OF METAL-RICH LIQUID WIRES THROUGH SEMICONDUCTOR MATERIALS, and U.S. Pat. No. 3,902,925 entitled DEEP DIODE DEVICE AND METHOD, filed Oct. 30, 1973, on the inventions of Harvey E. Cline et al, and U.S. Pat. No. 3,998,662 entitled MIGRATION OF FINE LINES FOR BODIES OF SEMICONDUCTOR MATERIALS HAVING A (100) PLANAR ORIENTATION OF A MAJOR SURFACE, filed on Dec. 31, 1975 on the invention of D. E. Houston et al. As described in the last cited U.S. Pat. No. 3,998,662, the aluminum mixes with silicon at a sufficiently high temperature to form a molten eutectic solder. The eutectic solder formed by providing sufficient aluminum on the heated surface of the silicon, collects in small clusters under the influence of surface tension on the heated silicon surface. Under the influence of a thermal gradient and at a sufficient temperature, zone melting takes place at the surface, forming additional eutectic solder. The eutectic then propagates through the bulk of the silicon following the thermal gradient. The propagation rate is relatively rapid, being capable of penetrating a 0.040 mil silicon substrate in several minutes. When the melt has crossed through the semiconductor substrate, and the substrate has been cooled, a plurality of somewhat randomly spaced columns of aluminum/silicon alloy have been formed between the top and bottom surfaces of the substrate.

The preferred propagation direction of the TGZM process is along the 100 axis of the silicon material. If the thermal gradient and aluminum rich eutectic are applied to facilitate 100 axis propagation, vertical columns of relatively constant cross-section result. Thus, the silicon substrate should be provided with the 100 crystalline axis perpendicular to the bottom and top surfaces of the substrate. The vertical columns which result from TGZM processing, are of quite small cross-sectional dimensions (generally less than 200 microns), but each column is of high specific conductivity. The increase in conductivity through the silicon is substantial, and the lateral extent of the conductive region can be controlled with greater precision (on the order of 50-100 microns) than using degenerative doping. Degenerative doping also achieves a relatively high through-the-substrate conductivity but the lateral extent of the doped region is less accurately controlled since the driving mechanism is the concentration gradient. Good lateral precision in defining conductive zones is required since high resistivity silicon is used as a dielectric for isolation of signal and dc conductors from ground in close proximity to conductive zones.

The conductive vertical columns produced by TGZM are also used to produce low impedance paths to ground between the bottom metallization 32 and the Kovar cover 40. Conductive vertical columns 27A extend between the bottom metallization 32 and the patterned metallization 33 grounding portions of metallization 33. In addition, the silicon member 41, used to seal the cover 40 to the substrate may use TGZM formed columns 27B to make contact between a conductive metallic layer formed on the upper surface of the member 41 and grounded portions of metallization 33, thus completing a conductive path from the cover 40 to the substrate ground plane 32.

In fabricating the FIG. 2 package, the recesses in the silicon substrate 31 are normally formed first, followed by the formation by the TGZM process of the vertical columns 27A, 38, 39. The recesses thus have bottoms of the required planarity, and the thickness for propagation of the melt is reduced. The ground portions of the surface metallization, 33 and surface metallizations 36 and 37, which must be electrically continuous with their respective TGZM formed columns, are formed next.

On the under surface of the substrate, which need not be soldered, a sputtered aluminum layer may be used to provide the bottom ground plane 32 of the substrate. In the bottoms of the recesses, the grounded metallizations 36 and 37 may be of aluminum with a nickel barrier to which gold is added to a depth suitable for forming a solder die-bond with the MMIC chips.

Because the TGZM through-the-chip grounding can be created in localized regions of the silicon substrate, other regions of the same silicon substrate may be maintained at high resistivities. Accordingly, conventional high temperature silicon processes may be used to pass the RF and dc electrical connections through the hermetic seals to the package I/O terminals 28 in electrical isolation from the grounded TGZM conductors 27A and 27B reliance on the high resistivity of bulk silicon. Thus, conventional silicon metallization runs 33 may be used on the high resistivity silicon under the package seals and conventional silicon compatible hermetic package seals may be used, such as a diffusion bond of a silicon ring 41 to the silicon substrate 31. After the diffusion bond, the package seal is completed by soldering the silicon ring 41 to the Kovar cover 40.

The electrical connections between the I/O pads 28 and the MMIC chips 42, 43 and the connections between these MMIC chips require two levels of patterned metallizations. The first patterned metallization (33, 34, 35), formed on the silicon substrate, provides a first level of connection. It extends from the I/O pads 28 crossing under the seal region to the substrate regions adjacent the edges of the MMIC chips bearing the pads 44-47. The second patterned metallization (48, 49 and 50) formed on a dielectric layer 29 formed on the upper surfaces of the substrate 31 and chips 42 and 43 makes connections between the first patterned metallization (33, 34 and 35) and the pads 44, 45, 46 and 47 on the MMIC chips 42 and 43 in the same manner described in the first embodiment.

The connections between the first and second patterned metallizations are shown in FIG. 2. In particular, an element 33 of the first patterned metallization is disposed in proximity to the pad 44 on the MMIC chip 42. Similarly, element 34 of the first metallization are disposed in proximity to the pads 45 and 46 on the MMIC chips 42 and 43 respectively. Similarly an element 35 of the first metallization is disposed in proximity to the pad 47 on the MMIC chip 43.

The dielectric layer 29 of the FIG. 2 embodiment is provided with perforations over the elements 33, 34, and 35 of the first patterned metallizations. The perforations are used to make connections to the MMIC pads and is provided with perforations over the pads 44 to 47 on the MMIC chips. The second patterned metallization (48, 49 and 50) applied to the perforated dielectric layer 30 in the manner described in connection with the first embodiment, coats the dielectric layer 29 and enters the respective perforations making point-to-point connections. The dielectric layer 29 is subsequently selectively removed by laser oblation (as in the first embodiment) and is present only in the vicinity of the pads 44-47 and is not present over the circuit elements of the MMIC chip to avoid detuning and parasitic effects.

An added advantage of the two level patterned metallizations is that not only are point-to-point connections possible but cross-overs are also possible.

The electronic packages illustrated in FIGS. 1 and 2 provide means for interconnecting a plurality of MMIC chips set within an enclosure. In general, the MMIC chips should be placed in close mutual proximity to reduce signal propagation times, losses and VSWR induced signal distortion. To avoid detuning and stray coupling, the connection paths should not traverse the active regions of the chips. Should it be desired to expand the area of the chip interconnections beyond that which is convenient above the chips, certain of the interconnections may be made in the silicon material of the substrate beneath the MMIC chips. Such an arrangement is illustrated in FIG. 3.

In the package illustrated in FIG. 3, the silicon substrate is formed of three diffusion bonded silicon members 51, 52, and 53 with metallizations on each surface. Two MMIC chips 54 and 55 are set into recesses formed in the upper most silicon member 53. The three silicon members 51, 52 and 53 are provided with interconnected TGZM formed conductive columns 56 and 80 (those in the recesses of 53 not being illustrated) for grounding the individual recessed MMIC chips to the substrate ground 57. In addition, the cover 58 is grounded through the cover seal using TGZM formed conductive columns in the same manner illustrated in FIG. 2. The substrate ground 57 completely covers the bottom surface of silicon member 51 as in the other embodiments.

The connections between MMIC pads and between MMIC pads and package I/O pads; cross-overs for these connections; and a hermetic cover seal, are provided by the three element substrate and metallizations on their surfaces. At least three of the metallizations are patterned for providing individual circuit connections.

In particular, element 59 of a second patterned metallization, disposed on the under surface of the uppermost substrate member 53, a first patterned metallization on the upper surface of the substrate member 53 both located in the region of the cover seal and an element of a third patterned metallization formed on dielectric layer 60 over the edge of MMIC chip 54 provide the means for making connections between an I/O pad 61 and a pad near the left edge of the MMIC chip. The second patterned metallization, which includes element 53, is formed before assembly of the substrate from its three elements 51, 52 and 53. The vias 62 and 63, which are formed subsequently in the silicon member 53, interconnect the I/O pad 61, an element of a first patterned metallization to an interior pad 64, also of the first patterned metallization to complete the connection from the I/O pad 61 to the interior pad 64. The conductor 65, an element of the third patterned metallization formed on the dielectric layer 60 completes the connection between interior pad 64 and the adjacent pad on the left edge of the MMIC chip 54. This connection is accomplished in the manner described in connection with the FIG. 2 embodiment.

Additional connections allowing for cross-overs may be similarly made by a patterned metallization 66, formed on the under surface of the substrate member 52, adjacent the member 51. The metallizations in this plane may be distributed throughout the substrate. The patterning provides isolation between point-to-point signal connections, power connections, and the through-the-chip grounding connections. The patterned metallization 66 is formed before assembly of the substrate, followed by creating vias 67 and 68 inside and outside the seal making contact with the pads 69 and 70, both elements of the first patterned metallization. The vias, which extend between the interior pad 69 and patterned metallization 66 and exterior I/O pad 70 and patterned metallization 66 respectively thus interconnect the I/O pad 70 to the interior pad 69. The interconnection between interior pad 69 and a pad near the right edge of the MMIC chip 55 is accomplished in the same manner earlier described. (While not illustrated, connections to the power plane 66 may also be located between the MMIC chips 54 and 55.)

The assembly of the multiple substrate members into a solid, hermetically sealed structure may be accomplished using conventional silicon technology. Diffusion bonds between permit the substrate members 51, 52 and 53 to be assembled in a rigid and hermetically sealed manner while at the same time permitting patterned conductive regions to exist between members.

The use of a silicon substrate has the further advantage of permitting efficient optical interconnection with optical circuits within the package while maintaining a hermetic seal. Such an arrangement is illustrated in FIGS. 4A, 4B and 4C.

The silicon substrate 71 is provided with localized doping to create an optical waveguide 72. The optical waveguide transverses the upper sub-surface portion of the silicon from a point outside of the hermetic cover seal 73 to a point inside the cover seal. The optical waveguide provides a connection between an external optical fiber 74 and an internal optical receiver/transmitter 75. The optical fiber 74 is bonded to a fiber centering V-groove 76, aligned with the optical waveguide section 72. The internal optical component, the receiver/transmitter 75 is set within a recess etched into the silicon to the depth required to provide substantially coplaner electrical connections with any other MMIC chips, which may be provided within the package by the interconnection methods previously outlined.

FIGS. 4A, 4B and 4C illustrate the disposition of the principal members required for making the optical connection. The V-groove may be fabricated by one of several wet or dry fabrication techniques. The positioning of the fiber is critical to effective low loss interconnection. Assuming single mode fibers, the optically active region of the fiber is only 8-10 microns, and the alignment of the fiber with the optical element 75, must be of commensurate accuracy. Silicon processing, with its high accuracy, and total lack of granularity permits this degree of accuracy in making optical connections. The optical waveguide 72, which facilitates the passage of a signal into the package, is achieved by a patterned doping of the semiconductor, which poses no particular problem in providing a hermetic seal by a diffusion bond, as described in the FIG. 2 and FIG. 3 embodiments.

Current fiber optic modules are typically non-hermetic. Those that are hermetic typically utilize a fiber with solderable metallization on its exteior which is inserted through a metal tube in a package wall. The fiber is aligned to electro optical components inside the package and then the fiber is soldered in place. The present arrangement utilizing a V-groove is both hermetic and more convenient to use than the metallic tube. The convenience stems from the fact that etching a V-groove in the silicon is readily performed.

While the optical connection is illustrated in a substrate of the type shown in FIG. 2, it should be apparent that optical connections may also be used in the other configurations.

The FIG. 1 arrangement requires the least processing. Simplicity in processing and lower cost is achieved by using a uniformly doped substrate, as opposed to creating local, highly doped regions under individual chips, and using a metallized dielectric layer to achieve a seal.

In all described arrangements, the photolithographically patterned metallizations may be accurately dimensioned in relation to near ground planes to maintain good transmission line quality. The match continues even though the dielectric layers become quite thin, since the width of the metallizations may be accurately controlled and maintained in the correct proportions to maintain the desired characteristic impedances. The process preserves accuracy in the transmission line characteristics both within the package where the paths are principally between individual chips as well as where the paths pass through the package seals.

The use of increased through-the-substrate conduction readily practiced with silicon, which supplements the conductive ground metallizations, tends to prevent any significant build up of ac or dc impedance as one proceeds along the hybrid assembly.

The disclosed embodiments of the invention utilize silicon for a substrate material. This material, whose processing is now mature, offers many advantages over other known packaging materials, and the resulting package has many advantages over other known electronic packages. The silicon substrate permits batch fabrication by providing easily formed recesses of accurate depth to achieve coplanarity of the various chips used in the package. The silicon material is inexpensive, abundant, and of high quality mechanically. It has high thermal conductivity, and provides a close match of its thermal coefficient of expansion to the other components. It can be made selectively conductive. It provides a low loss optical medium, facilitating the incorporation of an optical waveguide into the substrate to interconnect optical components in the package. Precise physical features such as recesses and V-grooves are readily created in silicon.

What is claimed is:

1. A conductively enclosed hybrid integrated circuit assembly for operation at microwave and millimeter wave frequencies comprising:
    (a) a substrate of silicon having at least one shallow recess of a predetermined depth and having a flat bottom for reception of an integrated circuit chip, the upper and under surfaces of said substrate, including the bottom of each recess, being conductive and connected together to provide a low impedance signal ground,
    (b) at least one integrated circuit chip having a thickness equal to said predetermined depth, the upper surface thereof having electrical terminal pads thereon and the under surface thereof having a ground plane, bonded to the bottom of said recess to bring the upper surfaces of said at least one chip and substrate into coplanarity, the bond being electrically conductive to connect the chip ground plane to the substrate signal ground,
    (c) a first dielectric layer bonded to the upper surface of said substrate and to the upper surface of said at least one chip for bridging said upper surfaces, said dielectric layer being perforated over said chip terminal pads and in a cover sealing region;
    (d) a first patterned metallization applied to said first dielectric layer and penetrating said perforations for connection to said chip terminal pads, for input- /output (I/O) connections and for electrically grounding a cover, (e) a second dielectric layer having the bottom surface bonded to the upper surface of said first dielectric layer and perforated over said first metallization for I/O connections and in said cover sealing region, said first and second dielectric layers bounding said first patterned metallization being of a thickness suitable for efficient wave transmission at said operating frequencies, (f) a second patterned metallization applied to said second dielectric layer and penetrating said perforations for I/O connection and in said cover sealing region for attaching and grounding a conductive cover, and (g) a conductive cover for said assembly of a solderable material, solder-sealed to the cover attaching surfaces of said second patterned metallization to complete a sealed, conductive enclosure.

2. The assembly set forth in claim 1 wherein, all surfaces of said substrate are conductive.

3. The assembly set forth in claim 1 wherein, said silicon substrate is degeneratively doped to reduce electrical resistance through said substrate.

4. The assembly set forth in claim 1 wherein, said chips are monolithic microwave integrated circuits (MMICs) containing active and passive circuit elements, and wherein said first and second dielectric layers in combination with said metallizations provide microwave transmission lines to said chip terminal pads, said transmission line components being restricted to said chip terminal regions to minimize adverse interaction with said circuit elements.

5. A conductively enclosed hybrid integrated circuit assembly for operation at microwave and millimeter wave frequencies comprising:

(a) a substrate of silicon having at least one shallow recess of a predetermined depth and having a flat bottom for reception of an integrated circuit (IC) chip, the upper surface of said substrate having a first patterned metallization for internal and input-/output (I/O) connections, the under surface of said substrate and the bottom of each recess being conductive and connected to provide a low impedance signal ground, (b) at least one integrated circuit chip having a thickness equal to said predetermined depth, the upper surface thereof having terminal pads thereon and the under surface thereof having a ground plane, the under surface of said chip being bonded to the bottom surface of said recess to bring the upper surface of said chip into coplanarity with the upper surface of said substrate, the bond being electrically conductive to connect the chip ground to the substrate signal ground, (c) a dielectric layer bonded to the upper surface of said substrate and to the upper surface of at least one chip and bridging said upper surfaces, said dielectric layer being perforated over said chip terminal pads and over points on said substrate upper surface metallization, (d) a second patterned metallization applied to said first dielectric layer and penetrating said perforations to provide connections between chip terminal pads, between said chip terminal pads and said I/O connections, the combined use of said first and second patterned metallizations permitting crossovers, (e) a silicon wall is provided having its bottom surface bonded to the upper surface of said silicon substrate with said I/O connections of said first patterned metallization remaining outside of the bond and the internal connections of said first patterned metallization lying within the bond, and (f) a conductive cover for said assembly of a solderable material, solder-sealed to said silicon wall to complete a hermetically sealed conductive enclosure.

6. The assembly set forth in claim 5 wherein, thermal gradient zone melting is employed to reduce the impedance of said connection between the bottom of each recess and the under surface metallization of said substrate.

7. The assembly set forth in claim 6 wherein, thermal gradient zone melting is employed for connecting said cover to the under surface metallization of said substrate.

8. The assembly set forth in claim 7 wherein, said chips are monolithic microwave integrated circuits (MMICs) containing active and passive circuit elements, and wherein said first dielectric layer in combination with said metallizations provide microwave transmission lines to said chip terminal pads, said transmission line components being restricted to said chip terminal regions to minimize adverse interaction with said circuit elements.

9. The assembly set forth in claim 5 wherein, said silicon substrate is formed of three silicon members, each member having metallizations on each surface, adjacent silicon member being hermetically sealed together and said cover being sealed to the upper most silicon member to form a hermetically sealed and rigid assembly.

10. The assembly set forth in claim 9 wherein, said upper most silicon member has said chip reception recesses, and wherein said upper most silicon member has said first patterned metallization in the upper surface thereof for said (I/O and internal connections, and for an intermediate cover seal vias passing through conducting said upper most member to the under surface thereof, and a third patterned metallization on the under surface thereof and passing under said cover seal for interconnecting said I/O and internal connections in a path avoiding said cover sealing portion of said first metallization.

11. The assembly set forth in claim 10 wherein, the intermediate of said silicon member has a fourth patterned metallization on the under surface thereof, and conducting vias passing through said supper and intermediate silicon members for connecting said fourth patterned metallization of said first patterned metallization.

12. The assembly set forth in claim 10 wherein, the intermediate of said silicon member has a fourth patterned metallization on the under surface there, and said upper and intermediate silicon members and said dielectric layer for connecting said fourth patterned metallization to said second patterned metallization.

13. The assembly set forth in claim 10 wherein, the intermediate of said silicon member has a fourth patterned metallization on the under surface thereof, and conducting vias passing through said upper and intermediate silicon members for connecting said fourth patterned metallization of said first patterned metallization, the intermediate of said silicon member has a fourth patterned metallization on the under surface there, and said upper and intermediate silicon members and said dielectric layer for connecting said fourth patterned metallization to said second patterned metallization.

14. The assembly set forth in claim 5 wherein, at least one of said integrated circuit chips is optically active and disposed inside said cover bond, said silicon substrate being provided with a doped silicon optical waveguide leading under said cover bond to said optically coupled integrated circuit chip, and having in addition thereto an optical fiber attached to said silicon substrate outside of said cover bond, and aligned with said optical waveguide for providing optical signal connection to said optically active chip.

15. The assembly set forth in claim 14 wherein, said optically active chip is an optical transmitter/receiver for bilateral operation.

* * * * *